United States Patent
Happ et al.

(10) Patent No.: US 7,405,418 B2
(45) Date of Patent: Jul. 29, 2008

(54) MEMORY DEVICE ELECTRODE WITH A SURFACE STRUCTURE

(75) Inventors: Thomas Happ, Pleasantville, NY (US); Cay-Uwe Pinnow, München (DE); Michael Kund, Tuntenhausen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/058,412

(22) Filed: Feb. 16, 2005

(65) Prior Publication Data

US 2005/0180189 A1 Aug. 18, 2005

(30) Foreign Application Priority Data

Feb. 17, 2004 (DE) ............... 10 2004 007 633

(51) Int. Cl.
*H01L 47/00* (2006.01)
(52) U.S. Cl. ............... 257/3; 257/739; 257/1; 257/E21.012; 257/E21.02; 257/E29.112; 438/613
(58) Field of Classification Search ............ 257/1–5, 257/50, 529, 739, E21.012, E21.015, 309; 438/102, 103; 365/100, 163, 225.7
See application file for complete search history.

(56) References Cited

U.S. PATENT DOCUMENTS

| | | | | |
|---|---|---|---|---|
| 6,114,713 | A * | 9/2000 | Zahorik | 257/4 |
| 6,828,678 | B1 * | 12/2004 | Koutny, Jr. | 257/739 |
| 6,870,751 | B2 * | 3/2005 | Van Brocklin et al. | 365/96 |
| 7,098,503 | B1 * | 8/2006 | Marsh | 257/309 |
| 2002/0160551 | A1 | 10/2002 | Harshfield | |
| 2003/0189200 | A1 * | 10/2003 | Lee et al. | 257/1 |
| 2003/0203508 | A1 * | 10/2003 | Yates et al. | 438/1 |
| 2004/0036065 | A1 * | 2/2004 | Doan et al. | 257/3 |
| 2004/0109351 | A1 * | 6/2004 | Morimoto et al. | 365/171 |
| 2005/0122771 | A1 * | 6/2005 | Chen | 365/163 |

FOREIGN PATENT DOCUMENTS

| | | |
|---|---|---|
| EP | 1296377 A2 | 3/2003 |
| EP | 0894323 B1 | 7/2003 |
| WO | WO-99/54128 A1 | 10/1999 |
| WO | WO-2004/008535 A1 | 1/2004 |

* cited by examiner

*Primary Examiner*—Jerome Jackson
*Assistant Examiner*—Paul A Budd
(74) *Attorney, Agent, or Firm*—Slater & Matsil, L.L.P.

(57) ABSTRACT

The invention relates to a memory device electrode, in particular for a resistively switching memory device, wherein the surface of the electrode is provided with a structure, in particular comprises one or a plurality of shoulders or projections, respectively. Furthermore, the invention relates to a memory cell comprising at least one such electrode, a memory device, as well as a method for manufacturing a memory device electrode.

18 Claims, 3 Drawing Sheets

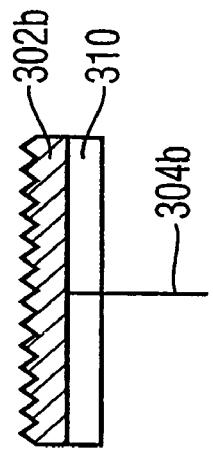
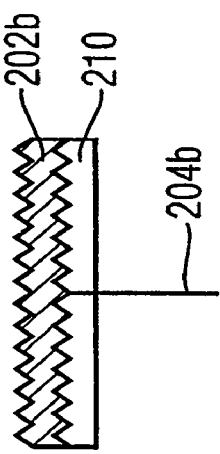
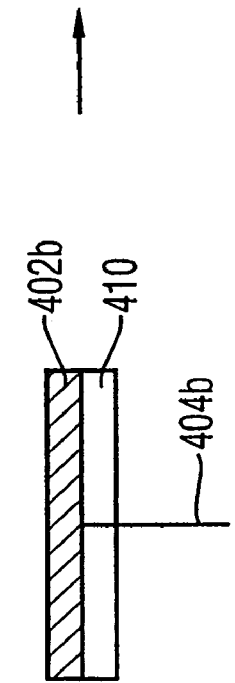

MEMORY DEVICE ELECTRODE WITH A SURFACE STRUCTURE

CLAIM FOR PRIORITY

This application claims the benefit of priority to German Application 10 2004 007 633.2, filed on Feb. 17, 2004, the contents of which are hereby incorporated by reference.

TECHNICAL FIELD OF THE INVENTION

The invention relates to a memory device electrode, a memory cell with at least one such electrode, and a memory device, as well as a method for manufacturing a memory device electrode.

BACKGROUND OF THE INVENTION

In the case of conventional memory devices, in particular conventional semiconductor memory devices, one differentiates between so-called functional memory devices (e.g. PLAs, PALs, etc.) and so-called table memory devices, e.g. ROM devices (ROM=Read Only Memory)—in particular PROMs, EPROMs, EEPROMs, flash memories, etc.—, and RAM devices (RAM=Random Access Memory or read-write memory), e.g. DRAMs and SRAMs.

A RAM device is a memory for storing data under a predetermined address and for reading out the data under this address later.

Since it is intended to accommodate as many memory cells as possible in a RAM device, one has been trying to realize same as simple as possible.

In the case of SRAMs (SRAM=Static Random Access Memory), the individual memory cells consist e.g. of few, for instance 6, transistors, and in the case of so-called DRAMs (DRAM=Dynamic Random Access Memory) in general only of one single, correspondingly controlled capacitive element (e.g. the gate-source capacitance of a MOSFET), with the capacitance of which one bit each can be stored as charge.

This charge, however, remains for a short time only. Therefore, a so-called "refresh" must be performed regularly, e.g. approximately every 64 ms.

In contrast to that, no "refresh" has to be performed in the case of SRAMS, i.e. the data stored in the memory cell remain stored as long as an appropriate supply voltage is fed to the SRAM.

In the case of non-volatile memory devices (NVMs), e.g. EPROMs, EEPROMs, and flash memories, the stored data remain, however, stored even when the supply voltage is switched off.

Furthermore, so-called "resistive" or "resistively switching" memory devices have also become known recently, e.g. so-called Perovskite Memories, Phase Change Memories, PMC memories (PMC=Programmable Metallization Cell), OUM memories (OUM=Ovonics (or Ovonyx, respectively) Unified Memories), hydrogenised, amorphous silicon memories (a-Si:H memories), polymer/organic memories, etc.

In the case of "resistive" or "resistively switching" memory devices, a material—which is, for instance, positioned between two appropriate electrodes (e.g. an anode and a cathode)—is placed, by appropriate switching processes, in a more or less conductive state (wherein e.g. the more conductive state corresponds to a stored, logic "One", and the less conductive state corresponds to a stored, logic "Zero", or vice versa).

In the case of PMC memories (PMC=Programmable Metallization Cell), for instance, when programming a corresponding PMC memory cell—depending on whether a logic "One" or a logic "Zero" is to be written into the cell—appropriate metal dendrites (e.g. Ag or Cu dendrites, etc.) are deposited between two electrodes by means of appropriate current pulses and by means of electrochemical reactions caused thereby (which results in a conductive state of the cell), or they are degraded (which results in a non-conductive state of the cell).

PMC memory cells are, for instance, known from Y. Hirose, H. Hirose, J. Appl. Phys. 47, 2767 (1975), and e.g. from M. N. Kozicki, M. Yun, L. Hilt, A. Singh, Electrochemical Society Proc., Vol. 99-13, (1999) 298, M. N. Kozicki, M. Yun, S. J. Yang, J. P. Aberouette, J. P. Bird, Superlattices and Microstructures, Vol. 27, No. 5/6 (2000) 485-488, and e.g. from M. N. Kozicki, M. Mitkova, J. Zhu, M. Park, C. Gopalan, "Can Solid State Electrochemistry Eliminate the Memory Scaling Quandry", Proc. VLSI (2002), and R. Neale: "Micron to look again at non-volatile amorphous memory", Electronic Engineering Design (2002).

In the case of Phase Change Memories, in a corresponding cell, a material positioned between two corresponding electrodes (i.e. an anode and a cathode) (e.g. an appropriate chalkogenide compound (e.g. a Ge—Sb—Te compound or an Ag—In—Sb—Te compound)) is placed in an amorphous, i.e. relatively weakly conductive, or a crystalline, i.e. relatively strongly conductive state by means of appropriate switching processes (wherein e.g. the relatively strongly conductive state may again correspond to a stored, logic "One", and the relatively weakly conductive state may correspond to a stored, logic "Zero", or vice versa).

Phase Change Memories are, for instance, known from G. Wicker, Nonvolatile, High Density, High Performance Phase Change Memory, SPIE Conference on Electronics and Structures for MEMS, Vol. 3891, Queensland, 2, 1999, and e.g. from Y. N. Hwang et al., Completely CMOS Compatible Phase Change Nonvolatile RAM Using NMOS Cell Transistors, IEEE Proceedings of the Nonvolatile Semiconductor Memory Workshop, Monterey, 91, 2003, etc.

In the case of the above-mentioned hydrogenised, amorphous silicon memories (a-Si:H memories), in a corresponding cell, a hydrogenised, amorphous silicon positioned between two corresponding electrodes (e.g. corresponding Cr—, V—, Ni—, Al—, Au—, Mg—, Fe—, Co—, Pd-electrodes) is—after an appropriate forming step—switched to a high-resistance or a low-resistance state by appropriate electric pulses (wherein, again, e.g. the low-resistance state may correspond to a stored, logic "One", and the high-resistance state may correspond to a stored, logic "Zero", or vice versa).

Hydrogenised, amorphous silicon memory cells are, for instance described in S. Gangophadhyay et al., Jpn. J. Appl. Phys. 24, 1363, 1985, and e.g. in A. E. Owen et al., Proceedings of the 5th International Conference on Solid State and Integrated Circuit Technology, 830, 1998, etc.

In the case of the above-mentioned Perovskite memory cells, a structure transition between a high-resistance state and a low-resistance state in a corresponding material (e.g. Perovskite oxides, oxidic insulating films with doped impurities, etc.) is achieved by means of charge carrier injection.

Perovskite memory cells are, for instance, known from S. Q. Liu et al., Appl. Phys. Lett. 76, 2749, 2000, and e.g. from W. W. Zhuang et al., IEDM 2002, etc.

Polymer/organic memory cells (e.g. charge-transfer-complex-based polymer/organic memory cells) are e.g. described in X. Wan et al., Phys. Stat. Sol. A 181, R13, 2000.

In the case of the above-mentioned "resistive" or "resistively switching" memory devices (Perovskite memories, Phase Change Memories, PMC memories, a-Si:H memories, polymer/organic memories, etc.), it is often tried to keep the layer thickness of the material positioned between the electrodes—which is correspondingly to be switched to a state of high or low conductivity—as small as possible.

This renders it possible to increase the field strengths achieved in the respective material, which may result in a correspondingly high switching rate.

SUMMARY OF THE INVENTION

The invention provides a novel memory device electrode, in particular a memory device electrode by means of which—with resistively switching memory devices—higher field strengths can be achieved than with conventional electrodes, as well as a novel memory cell comprising at least one such electrode, a novel memory device, in particular a resistively switching memory device, and a novel method for manufacturing a memory device electrode.

In accordance with one embodiment of the invention, a memory device electrode, in particular for a resistively switching memory device, is provided, wherein the surface of the electrode is provided with a structure, in particular, comprises one or a plurality of shoulders or projections, respectively.

With such an electrode, relatively high field strengths may be achieved with equal layer thickness of the respectively used active material to be "switched", which—with equal intensity of the respectively used switching voltages—results in correspondingly increased switching rates (or the respectively used switching voltages may be reduced with equal layer thickness, etc.).

BRIEF DESCRIPTION OF THE DRAWINGS

In the following, the invention will be explained in more detail with reference to several embodiments and the enclosed drawings. In the drawings:

FIG. 4 shows a section of a resistively switching memory cell according a further embodiment of the invention, for illustrating a possibility of the manufacturing of rough electrode surfaces.

FIG. 5 shows a section of a resistively switching memory cell according to a further embodiment of the invention, for illustrating a further possibility of the manufacturing of rough electrode surfaces.

FIG. 6 shows a section of a resistively switching memory cell according to a further embodiment of the invention during different phases of the manufacturing of the memory cell, for illustrating a further possibility of the manufacturing of rough electrode surfaces.

DETAILED DESCRIPTION OF THE INVENTION

Figure 1:
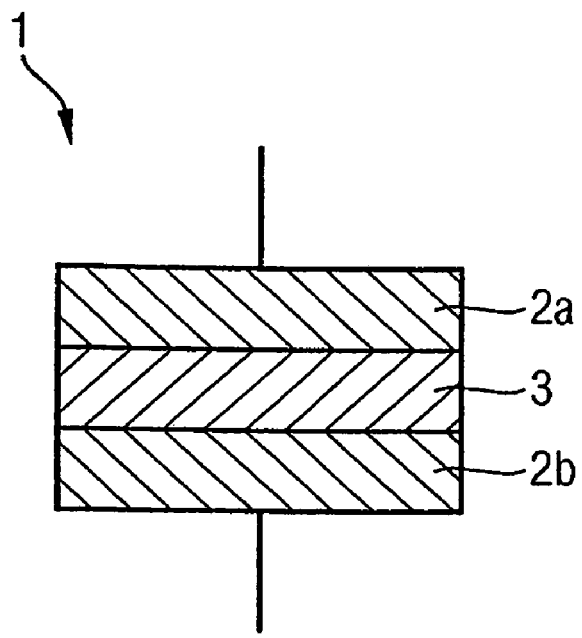
FIG. 1 shows the structure of a section of a resistively switching memory cell according to prior art.

FIG. 1 shows the structure of a section of a resistively switching memory cell 1 according to prior art.

It comprises two corresponding metal electrodes 2a, 2b (i.e. one anode and one cathode), between which a corresponding, "active" material layer 3 is positioned which is adapted to be placed, by appropriate switching processes, in a more or less conductive state (wherein e.g. the more conductive state corresponds to a stored, logic "One" and the less conductive state corresponds to a stored, logic "Zero", or vice versa).

As results from FIG. 1, the electrodes 2a, 2b comprise—with conventional, resistively switching memory cells 1—a smooth surface (in particular on the side facing the "active" material layer 3).

Figure 2:
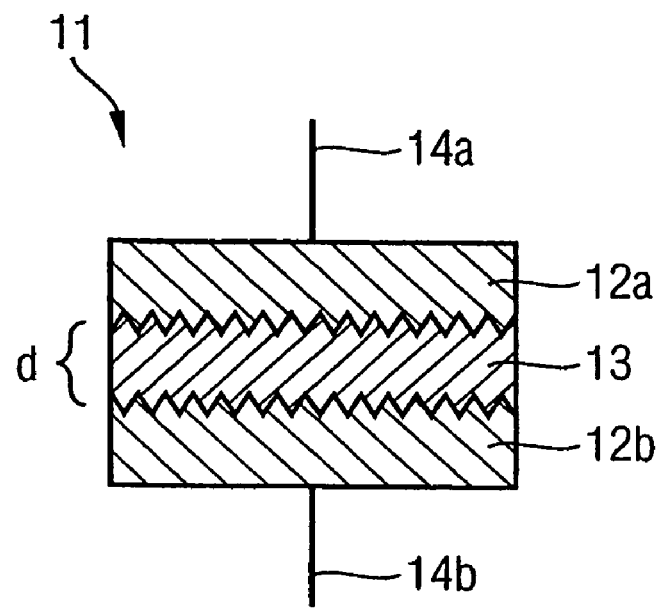
FIG. 2 shows the structure of a section of a resistively switching memory cell according to an embodiment of the present invention.

FIG. 2 shows the structure of a section of a resistively switching memory cell 11 according to an embodiment of the present invention.

It comprises two corresponding metal electrodes 12a, 12b (i.e. on e anode and one cathode), between which a corresponding, "active" material layer 13 is positioned (which may be surrounded laterally e.g. by one or several corresponding dielectric layers).

The active material layer 13 may be placed, by appropriate switching processes (i.e. by applying appropriate voltages/currents or voltage or current pulses, respectively, to corresponding control lines 14a, 14b that are connected with the metal electrodes 12a, 12b), in a more or less conductive state (wherein e.g. the more conductive states corresponds to a stored, logic "One" and the less conductive state corresponds to a stored, logic "Zero", or vice versa).

By means of a plurality of memory cells 11 that are of a structure similar to that of the memory cell 11 illustrated in FIG. 2 and that are positioned array-like side by side, a memory device with appropriate memory capacitance may be provided.

As will be explained in more detail in the following, and as is illustrated merely purely schematically in FIG. 2, with the memory cell 11—contrary to conventional, resistive memory cells 1 (cf. e.g. FIG. 1)—the electrodes 12a, 12b comprise (in particular on the sides facing the "active" material layer 13) a rough surface or a surface provided with an appropriate nanostructure, respectively (with appropriate "projections" or "tips", respectively, cf. below).

Alternatively, e.g. merely the upper electrode 12a (in particular its side facing the "active" material layer 13) may have a rough surface or a surface provided with an appropriate nanostructure, respectively (the lower electrode 12b then has—corresponding to conventional, resistively switching memory cells 1—(in particular on the side facing the "active" material layer 3) a smooth surface) (or vice versa).

Irrespective of the above-mentioned rough electrode surfaces or electrode surfaces provided with an appropriate nanostructure, respectively, the memory cell 11—that is illustrated only schematically in FIG. 2—may have a correspondingly similar or identical structure as conventional, resistively switching memory cells (e.g. so-called Perovskite Memory Cells, Phase Change Memory Cells, PMC memory cells, hydrogenised, amorphous silicon memory cells (a-Si:H memory cells), polymer/organic memory cells, etc.).

If, for instance, a PMC memory cell is used as memory cell 11, a chalkogenide layer (e.g. a GeSe or GeS layer) saturated e.g. with an appropriate metal (e.g. Ag (or e.g. Cu)) may be used as active material layer 13, or other suitable ionic conductor materials, such as WOx, may be used.

For programming the PMC memory cell 11 (depending on whether a logic "One" or a logic "Zero" is to be written into the memory cell 11), appropriate metal paths (e.g. Ag (or Cu) dendrites, etc.) are deposited in the above-mentioned chalkogenide layer by means of appropriate current pulses fed via the control lines 14a, 14b and by electrochemical reactions caused by same (which results in a conductive state of the cell 11), or they are degraded (which results in a non-conductive state of the cell 11) (cf. e.g. Y. Hirose, H. Hirose, J. Appl. Phys.

47, 2767 (1975), M. N. Kozicki, M. Yun, L. Hilt, A. Singh, Electrochemical Society Proc., Vol. 99-13, (1999) 298, M. N. Kozicki, M. Yun, S. J. Yang, J. P. Aberouette, J. P. Bird, Superlattices and Microstructures, Vol. 27, No. 5/6 (2000) 485-488, M. N. Kozicki, M. Mitkova, J. Zhu, M. Park, C. Gopalan, "Can Solid State Electrochemistry Eliminate the Memory Scaling Quandry", Proc. VLSI (2002), R. Neale: "Micron to look again at non-volatile amorphous memory", Electronic Engineering Design (2002), etc.).

If, for instance, a Phase Change Memory Cell is used as memory cell 11, an appropriate chalkogenide compound layer (e.g. a Ge—Sb—Te—or Ag—In—Sb—Te compound layer 13) may be used as active material layer 13.

The chalkogenide compound layer 13 may be placed in an amorphous, i.e. a relatively weakly conductive, or a crystalline, i.e. a relatively strongly conductive, state by appropriate switching processes (wherein, again, e.g. the relatively strongly conductive state may correspond to a stored, logic "One" and the relatively weakly conductive state may correspond to a stored, logic "Zero", or vice versa) (cf. e.g. G. Wicker, Nonvolatile, High Density, High Performance Phase Change Memory, SPIE Conference on Electronics and Structures for MEMS, Vol. 3891, Queensland, 2, 1999, Y. N. Hwang et al., Completely CMOS Compatible Phase Change Nonvolatile RAM Using NMOS Cell Transistors, IEEE Proceedings of the Nonvolatile Semiconductor Memory Workshop, Monterey, 91, 2003, etc.).

If, for instance, an a-Si:H memory cell 11 is used as memory cell 11, e.g. appropriate Cr—, V—, Ni—, Al—, Au—, Mg—, Fe—, Co—, or Pd-electrodes 12a, 12b may be used as electrodes 12a, 12b (e.g. a chromium and a vanadium electrode).

As active material layer 13, an appropriate layer of hydrogenised, amorphous silicon may be used which—after an appropriate forming step—is switched to a high-resistance state or to a low-resistance state by appropriate electric pulses (wherein, again, e.g. the low-resistance state may correspond to a stored, logic "One" and the high-resistance state may correspond to a stored, logic "Zero", or vice versa) (cf. e.g. S. Gangophadhyay et al., Jpn. J. Appl. Phys. 24, 1363, 1985, A. E. Owen et al., Proceedings of the 5th International Conference on Solid State and Integrated Circuit Technology, 830, 1998, etc.).

If, for instance, a Perovskite memory cell is used as memory cell 11, e.g. an appropriate Perovskite oxide layer 13, e.g. PbCrMnO, may be used as active material layer 13 (or, for instance, an appropriate oxidic insulating film with doped impurities, etc.) wherein—by charge carrier injection—a structure transition between a high-resistance state and a low-resistance state may be achieved (cf. e.g. S. Q. Liu et al., Appl. Phys. Lett. 76, 2749, 2000, W. W. Zhuang et al., IEDM 2002, etc.).

The size of the electrodes 12a, 12b—illustrated by example in FIG. 1—(in particular the size of the side faces or side face portions of the electrodes 12a, 12b facing the "active" material layer 13 and contacting same directly, and—as mentioned above—provided with a rough structure or with an appropriate nanostructure, respectively) may e.g.—depending on the respective memory technology used—be smaller than e.g. 1 μm×1 μm, in particular smaller than e.g. 500 nm×500 nm, e.g. smaller than 100 nm×100 nm, or smaller than 50 nm×50 nm, etc.

The layer thickness d of the active material layer 13 may—depending on the memory technology used—e.g. be smaller than 500 nm, in particular e.g. smaller than 100 nm, 50 nm, or 20 nm.

The structure size of the above-mentioned nanostructure provided on the electrode surfaces may advantageously be substantially smaller than the size of the electrodes 12a, 12b (or the size of the electrode side faces or electrode side face portions, respectively, facing the "active" material layer 13 and contacting same directly).

The average breadth or the average diameter, respectively, of the corresponding "projections"/"shoulders" or "tips", respectively, extending upwards or downwards, respectively, from the electrodes 12a, 12b and provided by the nanostructure may, for instance, be smaller than 100 nm, in particular smaller than e.g. 50 nm, 20 nm, or 10 nm (but in particular larger than e.g. 1 nm, 2 nm, or 5 nm) (each measured at the thickest position of the respective "projection" or the respective "tip", respectively).

The average height of the corresponding "projections" or "tips", respectively, extending upwards or downwards from the electrodes 12a, 12b and provided by the nanostructure may correspondingly e.g. be smaller than 100 nm, in particular smaller than e.g. 50 nm or 20 nm (but in particular larger than e.g. 2 nm, 5 nm, or 10 nm).

The number of "projections" or "tips", respectively, provided per electrode 12a, 12b (or—more exactly—per electrode side face or side face portion, respectively) and provided by the nanostructure may—in the extreme case—be equal to One (cf. e.g. FIG. 3), advantageously be larger than four, 10, 50, 100, or 300 (and e.g. smaller than 10,000, in particular smaller than 1,000 or 500).

It is of particular advantage when the "projections" or "tips", respectively, are distributed relatively evenly over the corresponding electrode side face (or the corresponding electrode side face portion, respectively).

In the following, several possibilities of manufacturing an electrode comprising a rough surface or a surface provided with an appropriate nanostructure (in particular on the side facing the respective "active" material layer)—corresponding to the electrode 12a illustrated in FIG. 2, or corresponding to the electrode 12b illustrated in FIG. 2—will be explained by way of example.

Figure 3:
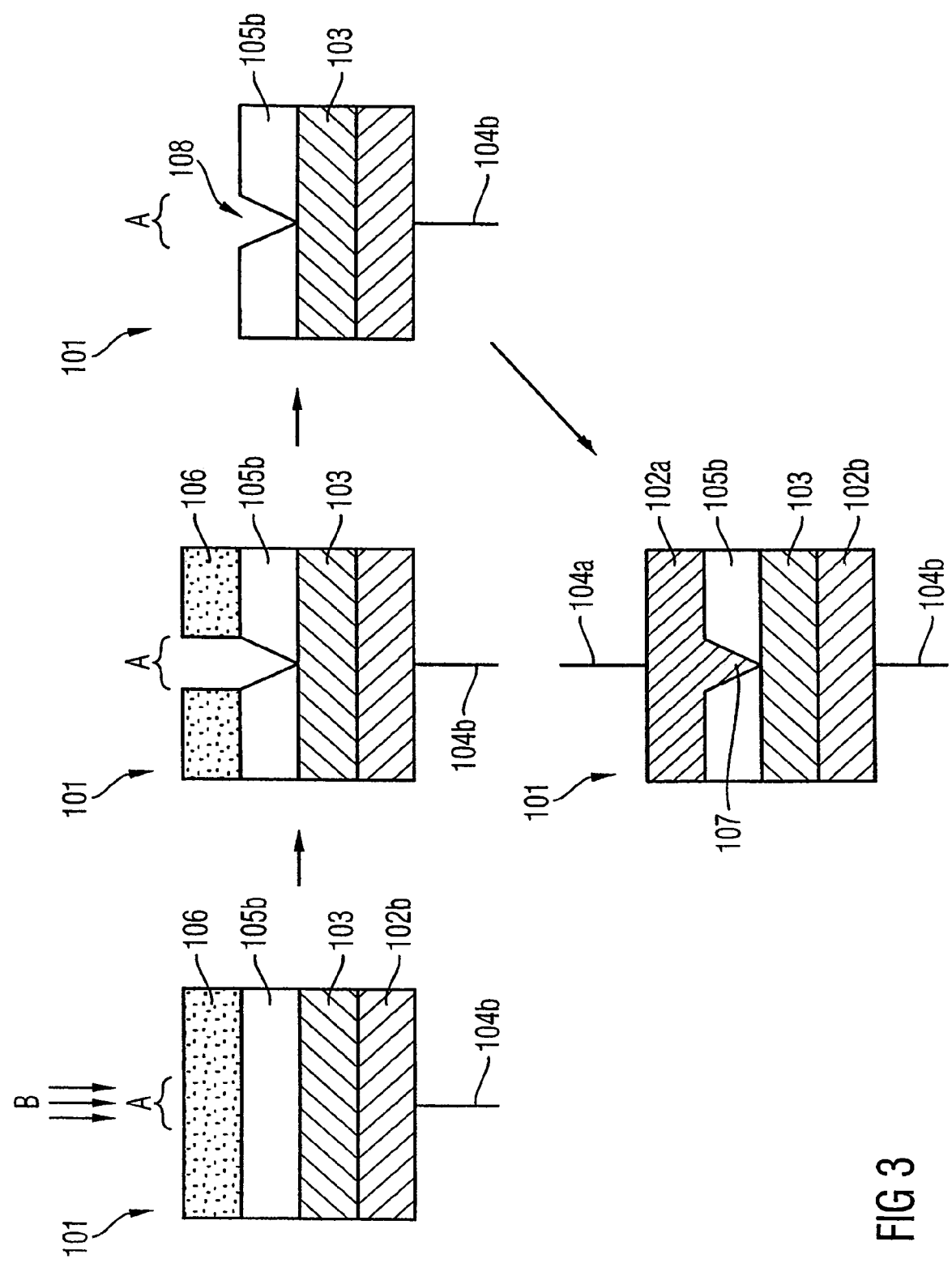
FIG. 3 shows a resistively switching memory cell according to a further embodiment of the invention during different phases of the manufacturing of the memory cell.

As is illustrated in FIG. 3, first of all the (lower) metal electrode 102b of an appropriate memory cell 101 may, for instance, be manufactured, as well as the "active" material layer 103 positioned thereabove, and e.g. the dielectric layer(s) surrounding same laterally (not illustrated).

Subsequently, a further, dielectric layer 105b is—additionally—deposited above the "active" material layer 103 and the dielectric layer possibly surrounding same (not illustrated), and an appropriate photoresist layer 106 is applied thereon.

Then, the surface of the photoresist layer 106 is exposed from the top (cf. the rays B) at a (for instance round (or, for instance, rectangular)) region A. The dimensions of the region A may correspond substantially to the dimensions of the upper lateral face of the "active" material layer 13 (the diameter (or the length or breadth, respectively) of the exposed region A may, for instance—depending on the memory technology used—be smaller than e.g. 1 μm, in particular smaller than e.g. 500 nm, 100 nm, or 50 nm), or e.g. be somewhat smaller.

Next, the photoresist layer 106 is developed and subjected to an etching process.

By that, the section of the photoresist layer 106 positioned below the above-mentioned, exposed region A, and parts of the dielectric layer 105b positioned thereunder, are removed (so that—as is illustrated in FIG. 3—a recess 108 tapering downwardly, e.g. a cone-shaped (or e.g. a pyramidal) recess 108 is produced in the dielectric layer 105b).

The etching process is continued at least until the tip of the e.g. cone-shaped or pyramidal recess 108 produced by the etching has reached the upper side face of the "active" material layer 103.

If a monocrystalline dielectric layer 105b is used, a relatively sharp nanostructure (which will thus result in high field strengths) (here: the cone-shaped or pyramidal recess 108) can be produced by the preferred etching of particular crystal orientations.

Subsequently, the remaining photoresist layer 106 is removed, and an appropriate metal layer is applied over the dielectric layer 105b for providing a corresponding, further metal electrode 102a (and in so doing the recess 108 produced in the dielectric layer 105b is also filled with the appropriate electrode metal, so that a cone-shaped electrode tip 107 (or a shoulder 107 tapering correspondingly outwardly at the electrode)—contacting the "active" material layer 103—is produced. Alternatively, shoulders 107 with any other shape may also be produced, e.g. semicircular or elongate-rounded shoulders 107, etc.

For manufacturing electrodes comprising a rough surface or a surface provided with an appropriate nanostructure, respectively (e.g. the electrodes 202b, 302b, etc. having a structure corresponding to or correspondingly similar as the electrodes 12a, 12b illustrated in FIG. 2), an appropriate electrode metal can, for instance—as is illustrated schematically in FIG. 4—be deposited on a rough dielectric layer 210 or a dielectric layer 210 provided with a nanostructure, respectively (or on an appropriate substrate 210, respectively) (the layer produced thereby for the metal electrode 202b then has a substantially constant thickness).

Alternatively, as is illustrated in FIG. 5, an electrode metal layer 302b comprising a rough surface or a surface provided with a nanostructure, respectively, may (by selecting suitable deposition methods and parameters) be directly deposited on a corresponding substrate 310 having a smooth surface, or on a smooth dielectric layer 310, respectively.

Furthermore, as is illustrated in FIG. 6, first of all an electrode metal layer 402b having a smooth surface may be deposited on an appropriate substrate 410 or an appropriate dielectric layer 410, respectively, which is then correspondingly re-etched for producing a nanoporous surface structure.

If monocrystalline electrode materials are used, relatively sharp nanostructures (that are thus resulting in high field strengths) can be produced by the preferred etching of particular crystal orientations.

For producing electrodes comprising a rough surface or a surface provided with an appropriate nanostructure, respectively, any other methods may also be used, e.g. methods where a regular structure that is, for instance, provided in a relatively soft material is transferred to the—relatively hard—surface of the electrode by appropriate etching methods, e.g. by using so-called self-assembled polymer templates (cf. e.g. K. W. Guarini et al., J. Vac. Sci. Technol. B 20(6), 2788, 2002, etc.).

By using electrodes 12a, 12b, 102a comprising a rough surface or a surface provided with an appropriate nanostructure, respectively—in particular when producing corresponding "tips" or shoulders/projections tapering outwardly (here: downwardly or upwardly)—the field strengths achieved in the respective, "active" material layer 13, 103 can be increased, this resulting in that the respectively used switching voltages can, for instance, be reduced with equal layer thicknesses d, etc.

Furthermore, by using rough electrodes 12a, 12b, 102a or electrodes 12a, 12b, 102a provided with a structure, respectively, the effective size of the electrode surface is increased, this resulting in that e.g. nucleation or crystallization seeds can be produced purposefully (which may be particularly advantageous e.g. in the case of phase change memories, etc.)

| List of Reference Signs | |
|---|---|
| 1 | memory cell |
| 2a | electrode |
| 2b | electrode |
| 3 | active material layer |
| 11 | memory cell |
| 12a | electrode |
| 12b | electrode |
| 13 | active material layer |
| 14a | control line |
| 14b | control line |
| 101 | memory cell |
| 102a | electrode |
| 102b | electrode |
| 103 | active material layer |
| 104a | control line |
| 104b | control line |
| 105b | dielectric layer |
| 106 | photoresist layer |
| 107 | electrode tip |
| 108 | recess |
| 202b | electrode |
| 204b | control line |
| 210 | dielectric layer |
| 302b | electrode |
| 304b | control line |
| 310 | dielectric layer |
| 402b | electrode |
| 404b | control line |
| 410 | dielectric layer |

What is claimed is:

1. A memory cell, comprising:
    a layer with an upper surface and a bottom surface, the upper surface of the layer provided with a structure having a plurality of recesses;
    an electrode with an upper surface and a lower surface, the lower surface of the electrode contacting the upper surface of the layer, wherein the electrode is disposed on the layer such that the upper surface of the electrode is provided with a structure substantially corresponding to the structure of the upper surface of the layer and having a plurality of shoulders or projections substantially corresponding to the plurality of recesses on the upper surface of the layer; and
    an active material layer, with a top surface and a bottom surface, wherein the top surface of the active material layer contacts the bottom surface of the layer, and wherein the top surface of the active material layer contacts the electrode through the plurality of shoulders or projections.

2. The memory cell according to claim 1, wherein the structure on the upper surface of the electrode is a nanostructure.

3. The memory cell according to claim 1, wherein the plurality of shoulders on the upper surface of the electrode has an average height smaller than 500 nm or 100 nm.

4. The memory cell according to claim 1, wherein the plurality of shoulders on the upper surface of the electrode has a height larger than 1 nm.

5. The memory cell according to claim 1, wherein the plurality of shoulders on the upper surface of the electrode is substantially cone-shaped.

6. The memory cell according to claim 1, wherein the electrode comprises more than four shoulders or projections.

7. The memory cell according to claim 1, wherein the plurality of shoulders on the upper surface of the electrode is designed integrally with the electrode.

8. The memory cell of claim 1, wherein the active material layer comprises a chalcogenide layer.

9. The memory cell of claim 1, further comprising a second electrode in contact with the bottom surface of the active material layer.

10. A resistively switching memory cell, comprising:
at least one electrode having an upper and a lower surface, the lower surface of the electrode disposed on an upper surface of a layer, the electrode having a substantially constant thickness such that the upper surface of the electrode is provided with a structure substantially corresponding to a structure of the upper surface of the layer and having a plurality of shoulders or projections substantially corresponding to shoulders or projections of the upper surface of the layer; and
a lower surface of an active material layer in contact with the upper surface of the electrode, wherein the contact is made through the plurality of shoulders or projections on the upper surface of the electrode.

11. The memory cell according to claim 10, comprising at least one further electrode, the further electrode provided with a structure having one or a plurality of shoulders or projections, wherein the further electrode contacts an upper surface of the active material layer through the plurality of shoulders or projections on the further electrode.

12. The memory cell according to claim 11, wherein the electrode and the further electrode form an anode/cathode pair for the memory cell.

13. The memory cell of claim 10, wherein the layer is a dielectric layer.

14. A method for manufacturing a memory cell, the method comprising:
producing a layer with an upper surface and a lower surface, the lower surface of the layer provided with a structure having a plurality of recesses;
forming an electrode with an upper surface and a lower surface, the upper surface of the electrode contacting the lower surface of the layer, wherein the lower surface of the electrode and the upper surface of the electrode comprise a plurality of shoulders or projections that are substantially identical and parallel to each other, and wherein the plurality of shoulders or projections on the upper surface of the electrode substantially corresponds to the plurality of recesses on the lower surface of the layer; and
contacting an upper surface of an active material layer with the lower surface of the electrode, wherein the contacting is made through the plurality of shoulders or projections on the lower surface of the electrode.

15. The memory cell of claim 1, wherein the layer is a dielectric layer.

16. The method of claim 14, wherein the layer is a dielectric layer.

17. A method for manufacturing a memory cell, the method comprising:
forming a first electrode layer;
depositing an active material layer over a top surface of the first electrode layer;
forming a dielectric layer over the active material layer;
depositing and patterning a photoresist layer over the dielectric layer;
etching the dielectric layer to expose the active material layer using the patterned photoresist layer as a mask, wherein the etching forms pyramidal recesses in the dielectric layer; and
depositing a conformal second electrode layer over the dielectric layer.

18. The method of claim 17, wherein forming the first electrode layer comprises forming a plurality of projections on the top surface of the first electrode layer.

* * * * *